United States Patent
Chow et al.

(10) Patent No.: US 7,611,587 B2
(45) Date of Patent: Nov. 3, 2009

(54) THIN-FILM DEPOSITION EVAPORATOR

(76) Inventors: Peter P. Chow, 2317 Byrnes Rd., Minnetonka, MN (US) 55305; Masahiko Shibata, 5-8-14 Narita Higashi, Suginami-Ku, Tokyo (JP); Don G. Klein, 10985 99th Place N., Maple Grove, MN (US) 55369; Ralf M. Hartmann, 6802 Nicollet Ave. S., Richfield, MN (US) 55423

( * ) Notice: Subject to any disclaimer, the term of this patent is extended or adjusted under 35 U.S.C. 154(b) by 820 days.

(21) Appl. No.: 10/848,258

(22) Filed: May 17, 2004

(65) Prior Publication Data

US 2004/0255857 A1 Dec. 23, 2004

Related U.S. Application Data

(60) Provisional application No. 60/471,406, filed on May 16, 2003.

(51) Int. Cl.
*C23C 16/448* (2006.01)
*C23C 16/00* (2006.01)
*C23C 14/26* (2006.01)
*C23C 14/24* (2006.01)
*C23C 14/00* (2006.01)

(52) U.S. Cl. .............................. 118/726; 118/723 VE; 118/715

(58) Field of Classification Search ................ 118/712, 118/726

See application file for complete search history.

(56) References Cited

U.S. PATENT DOCUMENTS

| 4,488,506 | A | * | 12/1984 | Heinecke et al. ............ 118/667 |
|---|---|---|---|---|
| 5,336,324 | A | * | 8/1994 | Stall et al. .................... 118/719 |
| 5,451,258 | A | * | 9/1995 | Hillman et al. ............. 118/715 |
| 5,595,606 | A | * | 1/1997 | Fujikawa et al. ............ 118/725 |
| 5,670,212 | A | * | 9/1997 | Staring et al. ............. 427/255.6 |
| 6,086,677 | A | * | 7/2000 | Umotoy et al. .............. 118/715 |
| 6,190,732 | B1 | * | 2/2001 | Omstead et al. .......... 427/248.1 |
| 6,410,432 | B1 | * | 6/2002 | Hautala et al. .............. 438/680 |
| 2002/0197418 | A1 | * | 12/2002 | Mizukami et al. ........... 427/596 |
| 2003/0054099 | A1 | * | 3/2003 | Jurgensen et al. ........ 427/248.1 |
| 2003/0192471 | A1 | * | 10/2003 | Jurgensen et al. ............. 117/89 |

FOREIGN PATENT DOCUMENTS

| JP | 2001-279450 | * | 10/2001 |
|---|---|---|---|
| JP | 2002-030418 | | 1/2002 |
| JP | 2002-249868 | | 9/2002 |
| WO | WO 01/61071 | * | 8/2001 |
| WO | WO 02/27064 | * | 4/2002 |

OTHER PUBLICATIONS

Random House Webster's Unabridged Dictionary, Second Ed., 2001, pp. 455, 603 and 2105.*

* cited by examiner

*Primary Examiner*—Jeffrie R Lund
(74) *Attorney, Agent, or Firm*—Kinney & Lange, P.A.

(57) ABSTRACT

A material source evaporator for use with an evacuable interior deposition chamber in which evaporated materials are deposited on substrates comprising a container with an associated heater that can heat an vaporizable material provided in the container to provide a vapor thereof. A manifold having a plurality of output apertures also has an associated heater that can heat the material vapor provided in the manifold to remain sufficiently vaporous to pass out of output apertures which are in a selected pattern to provide a calibrated spatial distribution of material vapor that results in a deposition thereof in a layer on an adjacent substrate in a fixed position. Thus, the layer has a relatively uniform thickness.

5 Claims, 21 Drawing Sheets

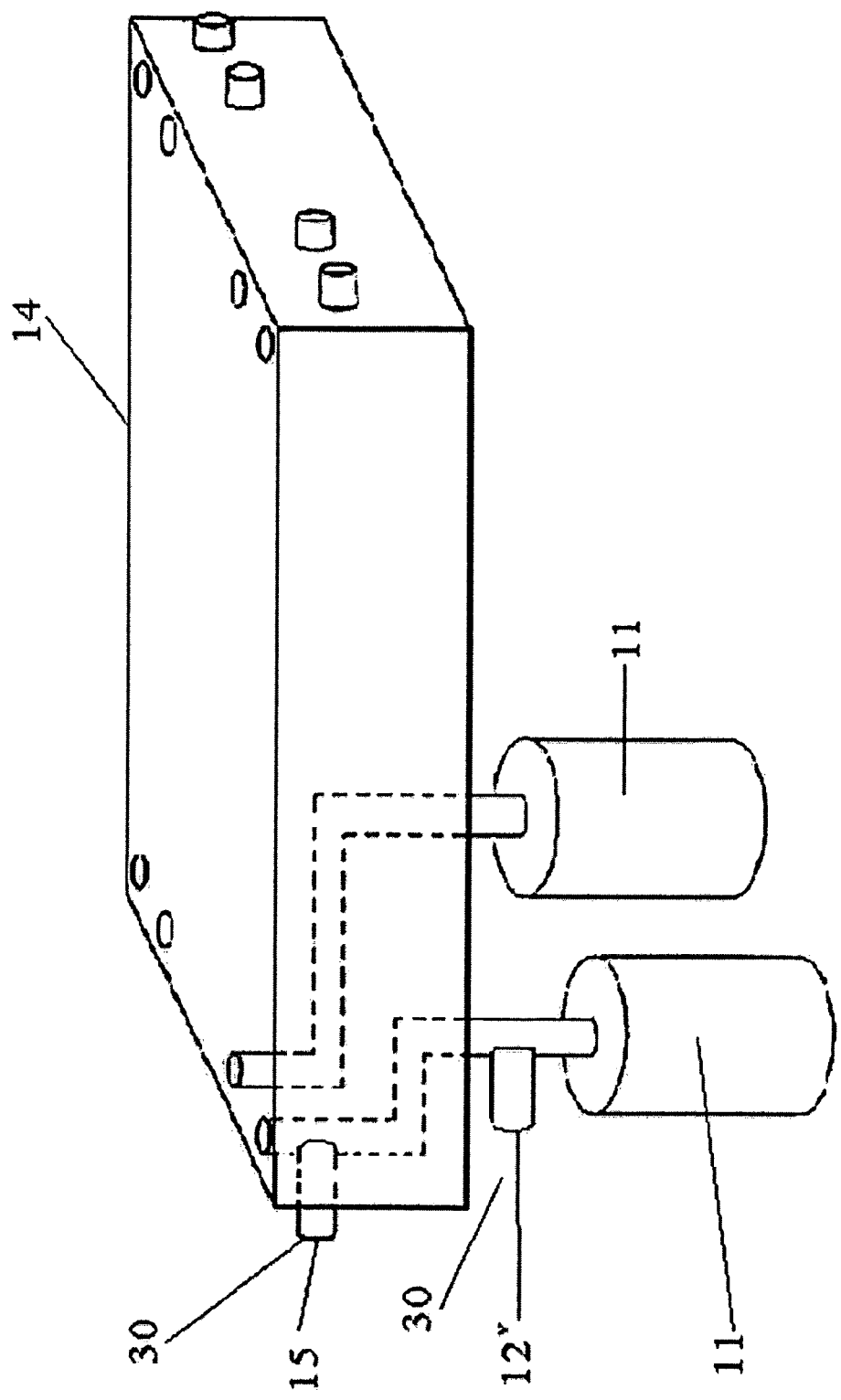

THIN-FILM DEPOSITION EVAPORATOR

CROSS-REFERENCE TO RELATED APPLICATION

This application claims the benefit of Provisional Application No. 60/471,406 filed May 16, 2003 for "THIN-FILM DEPOSITION EVAPORATOR".

BACKGROUND OF THE INVENTION

The present invention relates to organic thin-film structures and, more particularly, to thin-film structures such as organic thin-film light-emitting diodes and systems for the fabrication thereof.

Organic light-emitting diodes are of considerable interest in being used to form pixels in electronically operated flat panel electroluminescent displays. In comparison with backlit active-matrix liquid crystal based flat panel displays, such organic light-emitting diode based displays offer a greater viewing angle, more rapid responses to control signals and less power dissipation.

Such diodes are formed of two closely spaced electrodes of which at least one is transparent to visible light. In the narrow space between these two electrodes there is provided one, or more layers of, luminescent organic materials so that, when an electric current is established between the electrodes, such a layer emits light of a color depending on the particular organic material used. Thus, an organic material layer might be chosen to be of polythiopene for providing a red light, or of polyphenylenvinylen for green light, or of polyfluorene for blue light. The transparent electrode can serve as the flat panel substrate for fabricating the organic thin-film light-emitting diodes thereon, and is typically formed of glass with indium tin oxide deposited thereon to form an anode. The remaining electrode, the cathode, is a metal system such as magnesium-silver alloy, or lithium-aluminum alloy, or calcium.

In large quantity production of relatively large area organic light-emitting diode based flat panel displays, new manufacturing methodologies are needed to provide thin-films on the glass substrate that are uniform in deposited material characteristics, and in thickness, despite being formed at high rates over relatively large areas. One of the key techniques being used to form such films is evaporation film deposition where the material species of interest to be evaporated is heated to produce vapors thereof to form a flux of molecules along a desired path to the substrate for deposition thereon. This process takes place in a vacuum system which typically comprises a deposition chamber, some means therein on which to mount the substrate panel for selected material depositions thereon, a pump to evacuate the system, pressure gauges, and one or more material evaporation sources. Production of a uniform thin-film coating on the substrate surface, or on the surface of a previous layer coating the substrate or another previous layer, often requires rotation of the substrate panel to average the deposited flux over the substrate surface, or over the surface of a layer previously deposited on the substrate or another layer, to thereby reduce or eliminate any deposition nonuniformities resulting from flux distribution time or spatial variations.

There are a wide variety of material evaporation sources available and in previous use. The most common type of such evaporators utilizes thermal heating of the material species therein that is selected for deposition to produce a resulting vapor of that material, the evaporant. This material is initially provided inside a container, or crucible, in the evaporator which crucible is surrounded by closely adjacent heating elements. Layers of thermal shielding are provided about these heating elements and the crucible to thereby confine much of the heat generated to thereby cause it to diffuse into the crucible, the crucible having an opening therein through which the evaporant is allowed to escape to form the flux thereof. The spatial variation of the evaporant in the region outside this opening depends on the angle between the spatial location of interest and the center line of the crucible opening normal to the plane of the opening, and follows approximately a cosine function of that angle. Due to this approximate cosine distribution of the deposited evaporant flux, uniformity of the deposition can be improved by rotating the substrate about an axis more or less along the flux path. For relatively large area substrates, this rotation thereof in the deposition chamber becomes increasingly more difficult with increasing size, and the means for providing such rotation in the evacuated deposition chamber adds considerable complexity to the design and operation thereof. Thus, a material evaporator source which does not require rotation of deposition substrates therein is highly desired because such an avoidance reduces the complexity and cost of system manufacture and extends the mean time between failures of the system in operational use due to the resulting reduced number of moving parts to thereby reduce operating costs. However, as the size of substrate panels increases to thereby increase the resulting display viewing area, deposited thin-film uniformity becomes increasingly more difficult to achieve, especially without rotation of the substrates. Although better uniformity can be accomplished using multiple flux sources in the evaporator, consistent control of all such sources concurrently is difficult to achieve thereby making the desired film uniformity also difficult to achieve.

One variation used in material evaporation sources has been the addition of a vapor transport section which may be separated from the crucible by a valve mechanism. To prevent vapor condensation in this section, and also sometimes to change the chemical or physical nature of the evaporant, such a section is usually independently heated. Such a material evaporation source is more versatile because the valve mechanism allows fine adjustment of the flux to maintain stability and conserve material. However, the flux distribution reaching the substrate in the deposition chamber follows a similar approximate cosine distribution.

More recently in another material evaporation source variation, a gas distribution manifold has been added to the above described heated vapor transport section. This manifold is placed so as to be directly exposed to the surface of the substrate upon which depositions are to occur such that the evaporants are discharged and deposited on that substrate surface. This manifold may also serve as a means where two or more gas phase material species may be mixed before being discharged for deposition. Again a valve means is employed to allow controlling the amount of material discharged, or the flux. Also, again, however, the flux distribution after emission from a manifold opening to reach the substrate in the deposition chamber follows a similar approximate cosine distribution. Thus, there is a desire for a material evaporation source that can deposit a relatively uniform thin-film on a surface of a substrate, or on the surface of a film previously deposited on a substrate, without the need for rotating that substrate during depositions of films.

BRIEF SUMMARY OF THE INVENTION

The present invention provides a material source evaporator for use with an evacuable interior deposition chamber in which evaporated materials are deposited on substrates comprising a container having an output port and having an associated heater that can heat an vaporizable material provided in the container to provide a vapor thereof at its output port. A manifold having an input port and a plurality of output apertures also has an associated heater that can heat the material vapor provided in the manifold through the input port thereof to remain sufficiently vaporous to pass out of output apertures which are in a selected pattern to provide a spatial distribution of material vapor that results in a deposition thereof in a layer on an adjacent substrate in a fixed position. Thus, the layer has a thickness sufficiently uniform to be within three percent of the average thickness achieved over the substrate. A transport duct is provided extending between the container output port and the manifold input port. The manifold can be subdivided into separate submanifolds and the transport duct can be branched into several duct portions entering the manifold and extending to the output apertures. One or more valves can be positioned within the transport duct to control evaporant flux flow.

BRIEF DESCRIPTION OF THE DRAWINGS

FIGS. 9A and 9B show perspective views of components useable in the embodiments of FIGS. 1 and 8, FIGS. 10A and 10B show a schematic diagram of a system and a graph depicting aspects of the system operation for a system useable in the embodiments of FIGS. 1 and 8.

DETAILED DESCRIPTION

Figure 1A:
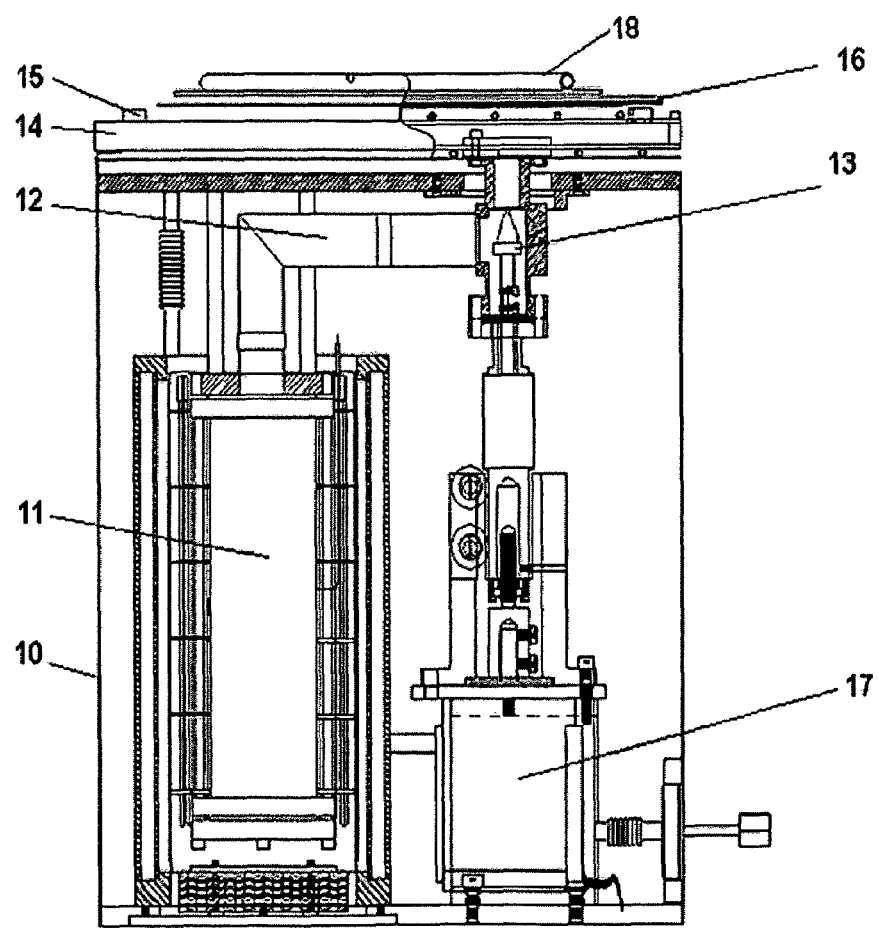
FIG. 1A shows a partially cut away side view of an evaporator embodying the present invention.

FIG. 1A shows a partially cut away side view of a material evaporation source, 10, of the present invention for fabricating various thin-film structures such as organic light-emitting diodes among others. Evaporator 10 has a separately heated crucible, 11, to generate a material vapor from the material species therein, that is connected by a heated transfer section or duct, 12, to convey the evaporant flux through an adjustable needle valve, 13, to an uniformly heated injector manifold, 14. Manifold 14 spatially distributes vapor flux generated in heated crucible 11 substantially equally over the entire surface of fixed position substrate panels in an evacuable region of a deposition chamber (shown as a horizontal line above source 10 in FIG. 1A) reachable by that flux by means of a series of exit apertures, 15, in this manifold that can be covered by an external shutter plate, 16. A motor, 17, controls the actuator stem of adjustable needle valve 13 to select the degree of opening of that valve to, in turn, control the evaporant flow into injector manifold 14. A heat shield, 18, water cooled if necessary, is provided to prevent undesirable heating of substrates in the deposition chamber from source radiation because some deposited materials may be temperature sensitive.

Crucible 11 is easily accessible by taking off a back plate on the evaporator enclosure to make replenishing the evaporator charge material species therein convenient, and to accommodate substituting different size crucibles. All inside surfaces of structures along the flux path are kept stable within a selected temperature range to eliminate flux material condensation on such surfaces. Shutter plate 16 is operated such that all the exit apertures 15 can be opened or closed both quickly and substantially simultaneously. The physical size of manifold 14, particularly the extent of the surface thereof facing substrates in the deposition chamber, can be scaled to the extent needed for suitable depositions on arbitrarily sized substrate panels.

Due to poor thermal conductivity of some kinds of initially provided material species to be used as the bases for evaporation in crucible 11, such as organic solids, achieving a homogeneous temperature of such material in an open crucible is difficult thereby resulting in fluctuation of transported flux quantities because the vapor pressure of the material evaporant is exponentially dependent on its temperature. In evaporator 10, the evaporation material species source charge provided in crucible 11 is located within a well enclosed container serving as that crucible to thereby provide excellent thermal equilibrium throughout that initial evaporation material charge. The large thermal mass of the crucible minimizes the temperature changes therein and so evaporation flux quantity value drifts. However, such a large thermal mass also means that making quick evaporation flux quantity changes by temperature adjustment of crucible 11 alone would be difficult to accomplish. Material evaporation source 10 therefore incorporates a fast acting valve to control flux flow through transfer section 12. Such an arrangement is provided by adjustable needle valve 13 which is operated through its actuator stem being selectively driven by motor 17 and a suitable mechanism connecting them, and with valve 13 and motor 17 both being suited to being included in a rate sensor based feedback loop to thereby control the maintaining of operating flux quantity values precisely at selected values therefor. At the end of each deposition, valve 13 can be completely closed to further flows through it to thereby save material usage. Since high purity organic materials used in fabricating organic light-emitting diodes are expensive, material conservation in using material evaporation sources is an important evaporator performance consideration.

Crucible 11 is kept at a selected constant temperature even with valve 13 closed so that when the next deposition is ready to begin the same flux value can be reproduced by returning the valve needle to the same predetermined position to provide the same size valve opening. With a motor-driven valve mechanism the flux quantity can be adjusted quickly, and arbitrarily selected profiles of flux quantities over time can be programmed into the motor controller. This latter arrangement is particularly useful if there is a need to adjust the composition of the thin film when more than one component or film material dopant is being deposited, or both. Due to the relatively large volume of injector manifold 14, changes in the flux quantity being emitted therefrom exhibits a time lag relative to the corresponding valve action. To ensure being able to sharply change the flux quantity, pneumatically operated shutter plate 16 is provided at exit apertures 15 of injector 14 so that flux emissions therefrom can be interrupted nearly instantaneously.

As shown in FIG. 1A, material deposition source 10 is a self-contained unit for easy installation in interior evacuable regions in deposition chambers where substrates are to be positioned to receive deposited thin-film layers thereon. Operation thereof is independent of its orientation thereby allowing flexibility in positioning source 10 face up as shown in FIG. 1A, or face down, or facing sideways.

Figure 1B:
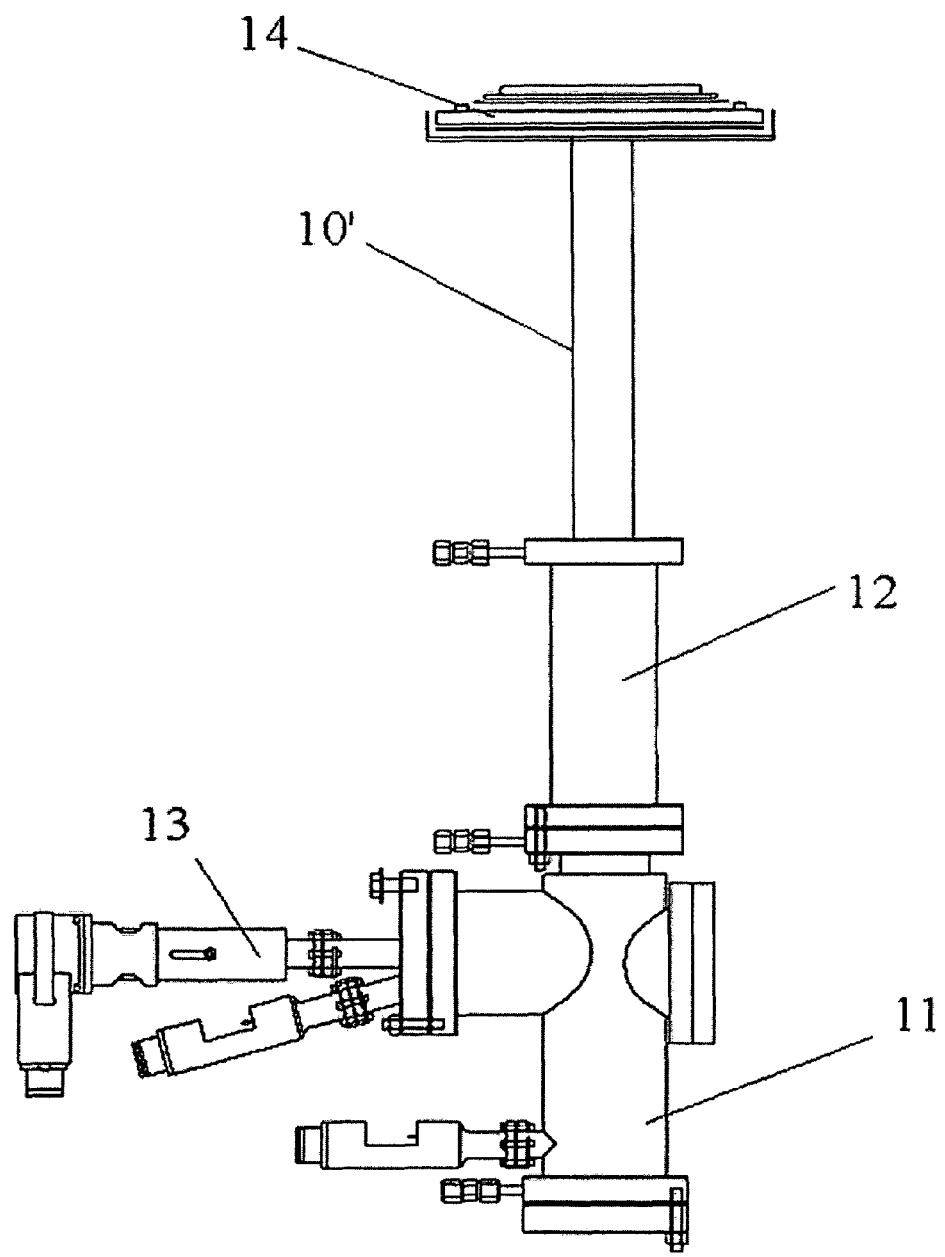
FIG. 1B shows a side view of an evaporator embodying the present invention.

Because of the modular nature of the components used in material deposition source 10, parts thereof can be provided external to the deposition chamber to thereby reduce space taken by source 10 in the vacuum maintained region of that chamber that otherwise would be needed to accommodate its structure. This possibility can lead to compact and efficient deposition chamber designs to make fabricating thin-film devices more economical. Thus, crucible 11 can be placed either inside or external to the vacuum deposition chamber so long as it is connected to manifold 14 through transport section 12 and valve 13. Such an external crucible arrangement is shown as another material source evaporator, 10', in a side view in FIG. 1B (a horizontal line above source 10' again represents a fixed position substrate panel) where the portion of heated transport section 12 and manifold 14 are in an evacuable region in a deposition chamber that is represented as a vacuum in that figure. The external portion of source 10', positioned outside the deposition chamber where it can be separately openable to the atmosphere without requiring the deposition chamber to also be similarly opened and so represented as atmosphere in the figure, has there the compartment containing crucible 11 and the external portion of heated transport section 12. These portions external to the deposition chamber are water cooled for personnel safety through three water line connections shown as the three shortest structural extensions that extend to the left in that figure. The remaining longer extensions that extend to the left in FIG. 1B are electrical connectors. This partially external material source evaporator arrangement is more fully explained below.

Figure 2A:
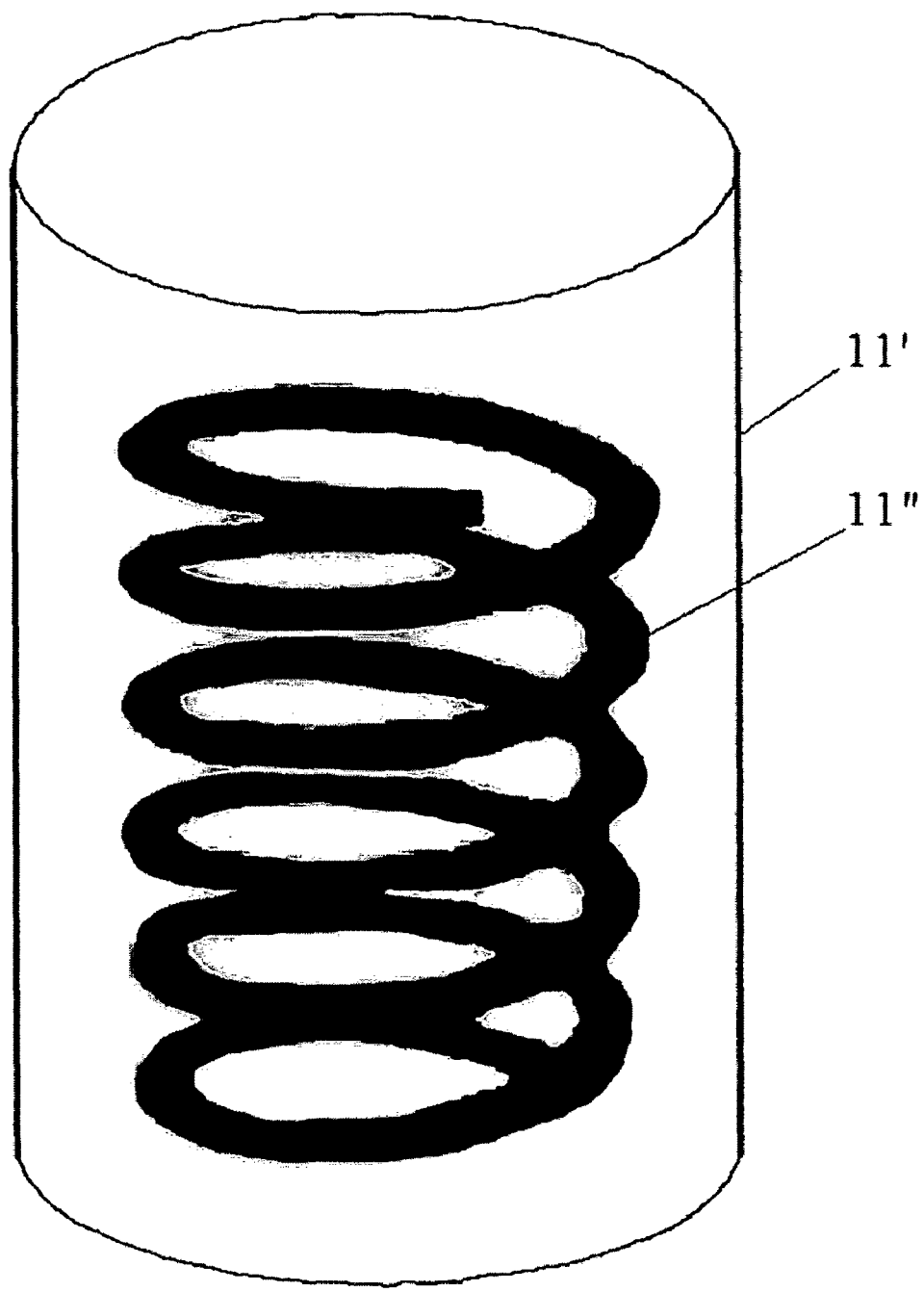
FIGS. 2A and 2B show perspective views of components useable in the embodiments of FIG. 1.
Figure 2B:
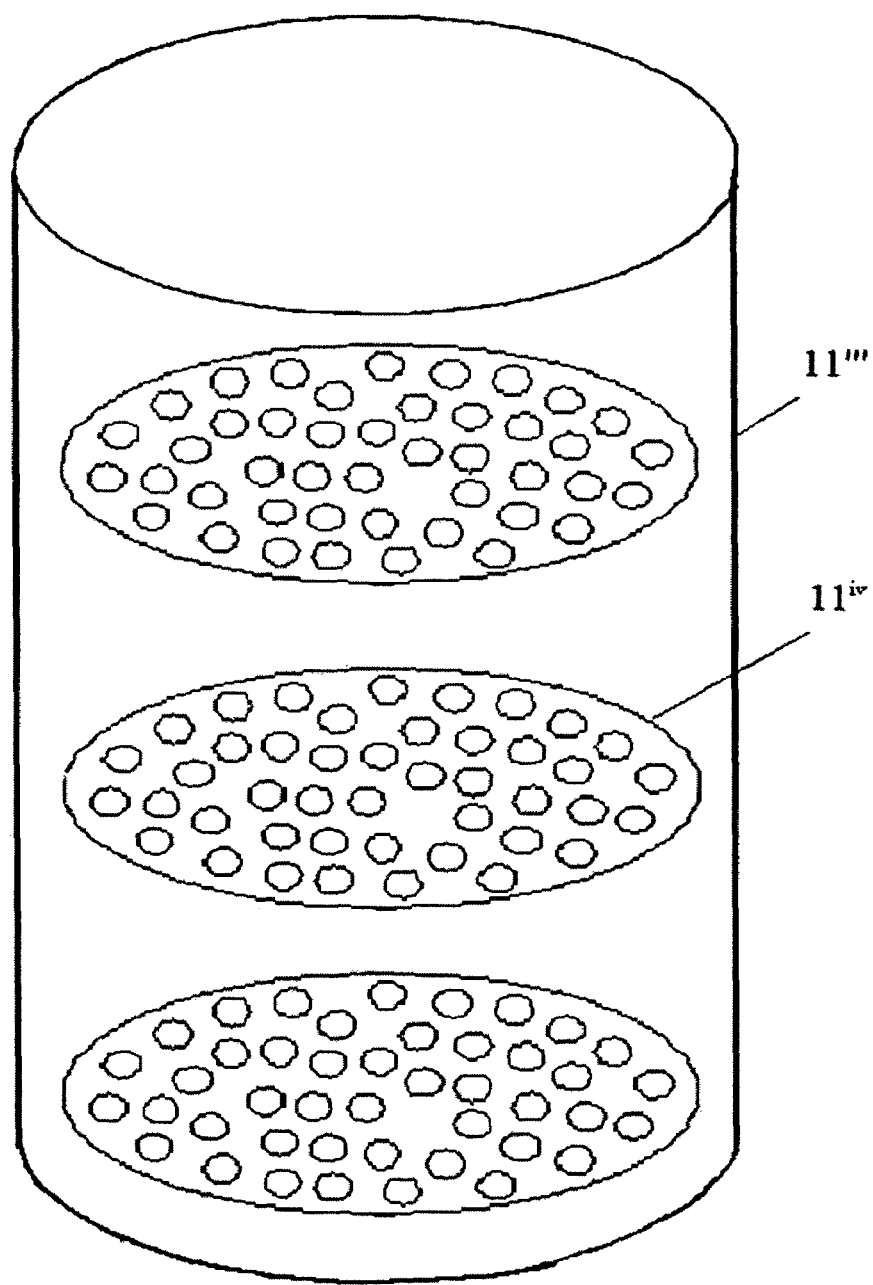

In improving both homogenous heating of, and relatively fast temperature changing of, the evaporant material species charge positioned in crucible 11, the material charge therein (typically in powder or solid chunk form) is dispersed to have good thermal contact to high thermal conductivity sheets or foils that can be also provided in that crucible. Several examples to increase charge material thermal uniformity are exhibited in the crucible alternatives shown in the perspective views of FIGS. 2A and 2B. An alternative crucible, 11', in its simplest form has a helical coil, 11", shown in FIG. 2A, or perhaps multiple coils, that are made of high thermal conductivity metal and which are positioned inside crucible 11" before the it is filled with an evaporative material species. In a further alternative, another alternative crucible, 11''', may instead be partitioned by metal plates, 11$^{iv}$ as shown in FIG. 2B, or metal meshes, to promote all of the evaporative material species being evenly heated. Perforations may be made in these plates such that the vapor flow resulting from vaporization of the material in the crucible is not hindered. Pyrolytic boron nitride (PBN) or other materials with high thermal conductivity may also be used in place of metal in these plates for this purpose.

Figure 3:
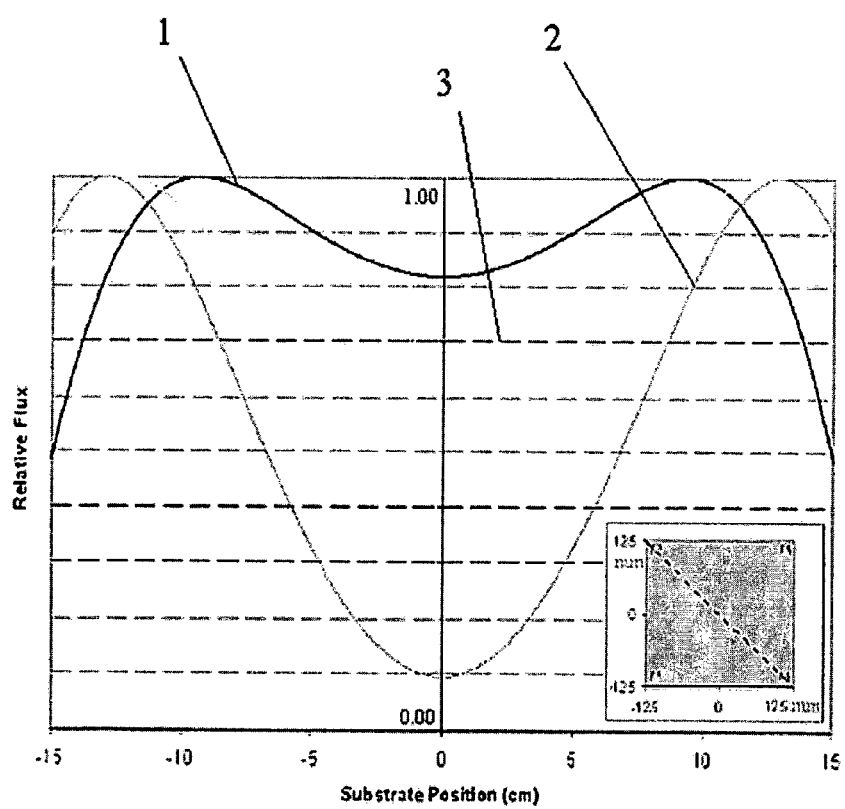
FIG. 3 shows a graph having plots indicating results available from different components useable in the embodiments of FIG. 1.

The pattern of positions of exit apertures 15 in injector manifold 14 is arranged to provide a substantially uniform coating of substrate panels in the deposition chamber. In determining same, simulation of flux distributions is typically first performed with some results thereof displayed in the graph of FIG. 3 for three variations of aperture count and position patterns. Here plots 1, 2 and 3 correspond respectively to a 4-hole pattern with one hole at each corner (plot 2); a 5-hole pattern with an additional hole of same open area in center (plot 3); and a 5-hole pattern but with the center hole of smaller diameter (plot 1). Significant smoothing of thickness variations can be realized by appropriately choosing the exit aperture numbers, positions and sizes.

Figure 4A:
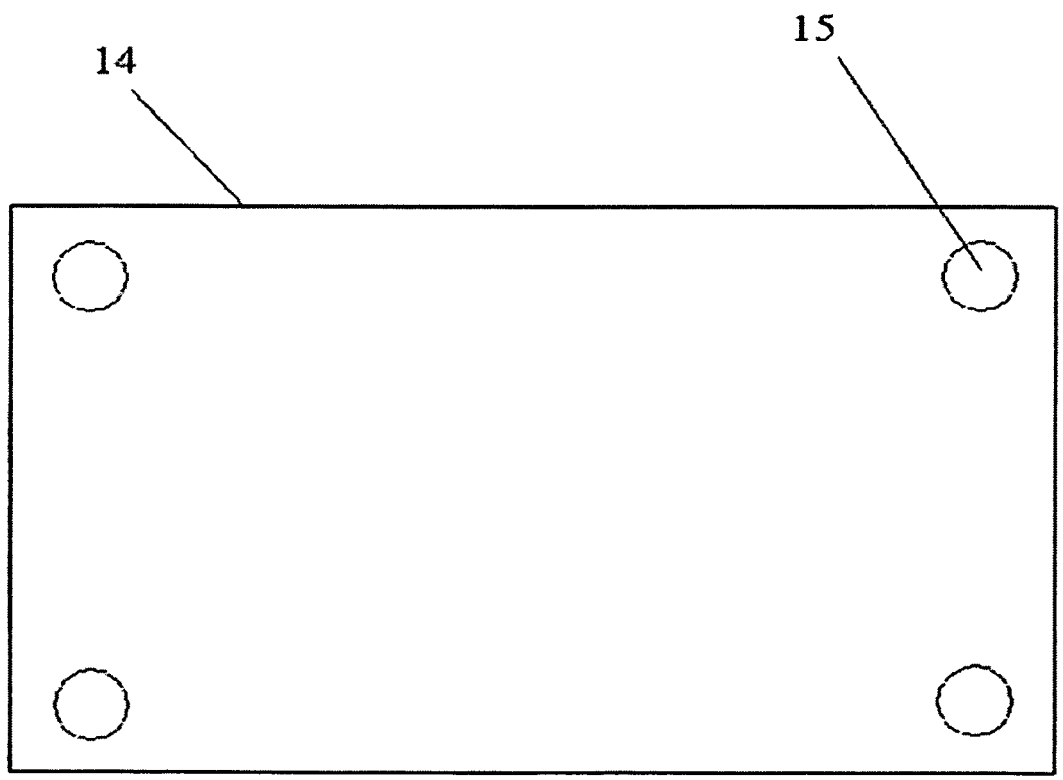
FIGS. 4A through 4F shows top views of different components useable in the embodiments of FIG. 1.

Such flux distribution simulations provide guidance to the appropriate selections of manifold exit apertures patterns. The basic approach is to use multiple sets of patterns, constructed with the aid of simulations and thickness calibrations. The primary hole pattern provides the main flux which can still lead to relatively large deposition nonuniformities. This primary pattern set of holes is represented by the four holes in the corners of the top plate of manifold 14 as shown in FIG. 4A. The thickness distribution of a deposited layer can be measured by any number of techniques, including stylus type depth profiling, electron microscope imaging, atomic force microscopy, optical interferometry (transmission or reflection measurement where the light intensity oscillation period is a function of the layer thickness and wavelength of the light.)

Figure 4B:
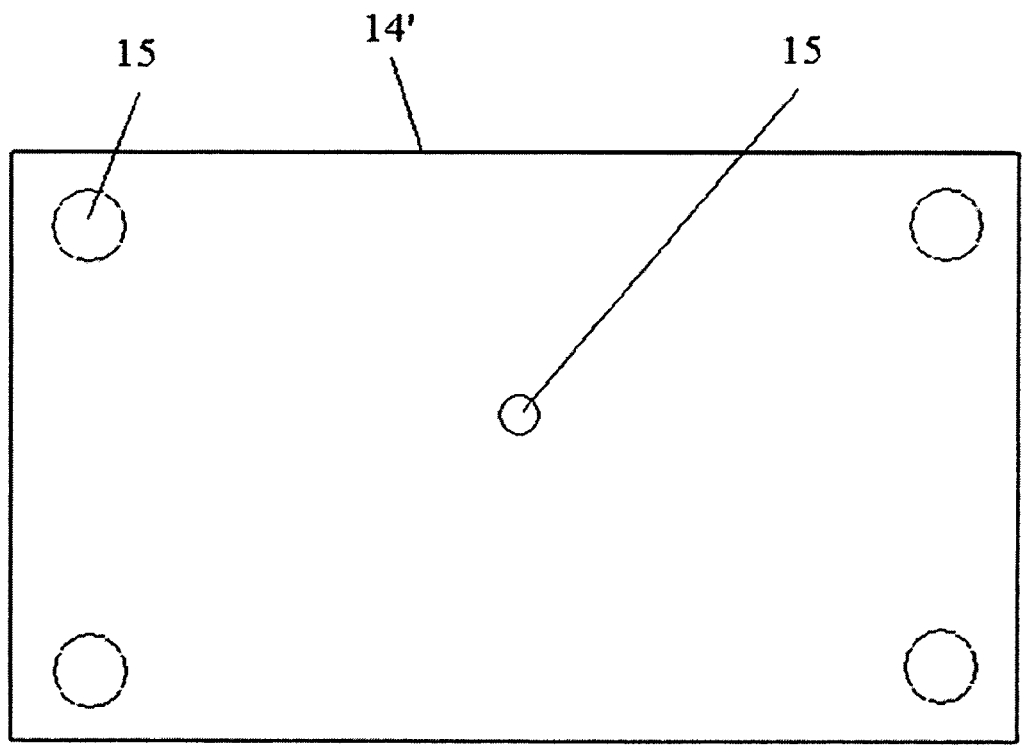
Figure 4C:
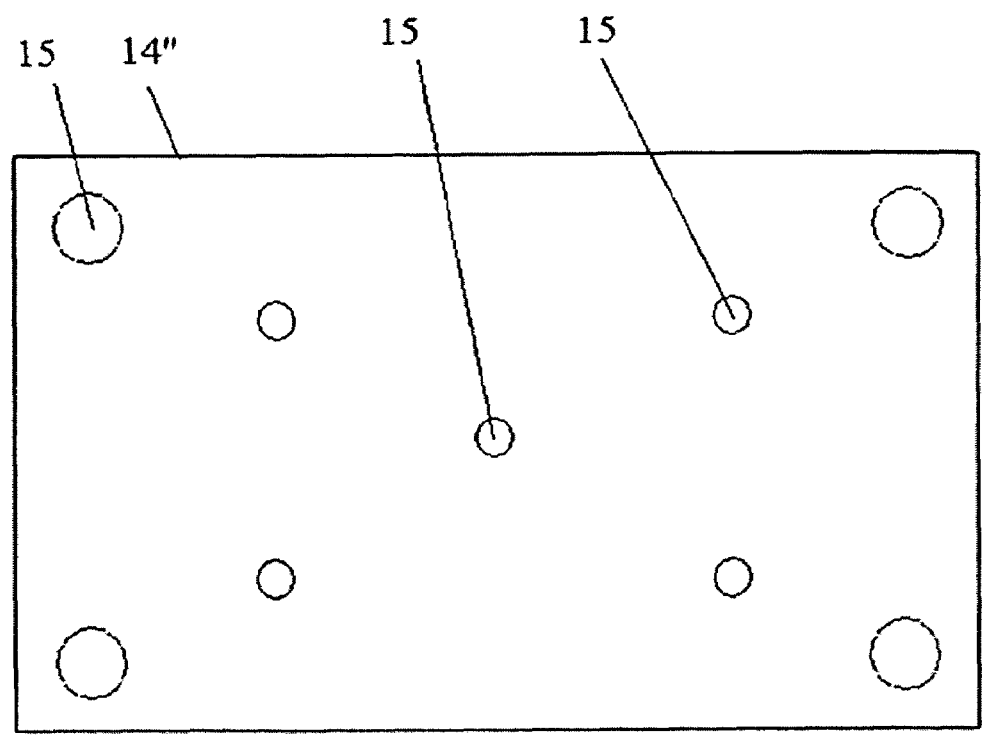

After thickness measurements of the deposited layers in an initial trial deposition, a second set of exit holes pattern in another manifold, 14', may then be used to provide finer adjustment of the flux distribution. In FIG. 4B this is represented by the single hole in the center which has a smaller open area. When needed, as determined by simulation and thickness uniformity measurement, an additional third set of exit holes pattern in yet another manifold, 14", shown with additional holes in FIG. 4C, can be provided to effect an even finer adjustment. These multiple sets of holes patterns described here are given for illustration only, and other similarly precise or better precision hole flux emission hole patterns can be found through using flux simulations and systematic calibrations as has been described. The flux distribution of the vaporized material may vary as function of a number of variables such as the molecular weight of the evaporant, the evaporation rate, the residence time on heated surfaces in the flux path, and the evaporation pressure just inside the manifold adjacent to exit holes 15. The systematic procedure outlined above, when used with the guidance provided by simulations, thus allows incrementally refined uniformity in deposition coatings on substrates provided in the deposition chamber. The overall deposition on a substrate is the sum total of the flux contributions from all the holes in a selected set provided in a manifold 14. The results of such depositions can be made to reach a selected uniformity, and this can be within plus or minus three percent of the average thickness of the deposited material on the substrate over the entire area of the substrate on which such deposition takes place without rotation of that substrate, by using a sufficiently complex arrangement of holes 15 in a manifold to effect the necessary fineness in spatial flux distribution to result in the desired deposited material distribution. These results are further aided by forming the manifold to have an area on the surface through which output aperture holes extend that is generally sized to match the extents of the substrate surfaces on which depositions through the corresponding manifold is to occur.

Figure 4D:
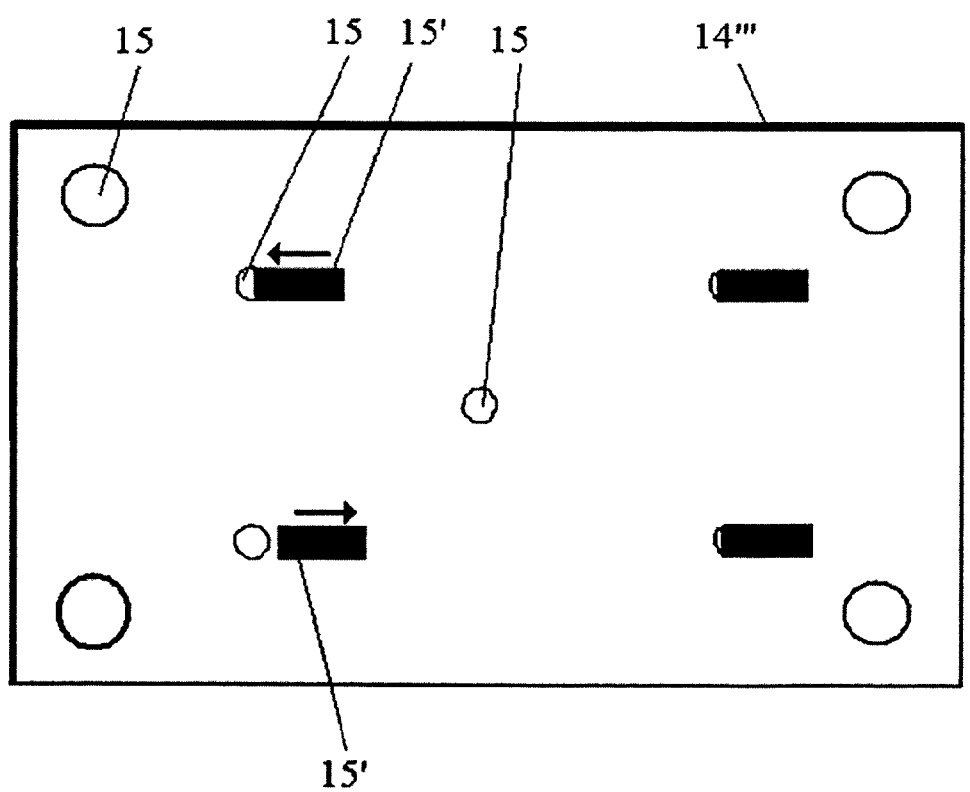

In achieving these finer adjustments, a change in the original hole 15 size or orientation can further modify the resulting flux distribution. A simple means is to use a movable cover, 15', that can be actuated to cover some or all of an original hole 15 thereby varying the opening area size and its geometric shape. This is illustrated in FIG. 4D in which movable covers 15' can be made to cover variable areas of each associated hole 15 when actuated during the process. The actuation of movable covers 15' may be effected by convenient electrical or mechanical means such as gears, bellows or cables any of which can be actuated by pneumatic or electrical means or by other suitable means such as by magnetic coupling means. The motion of movable covers 15' can be made to occur either linearly or in rotary fashion.

Figure 4E:
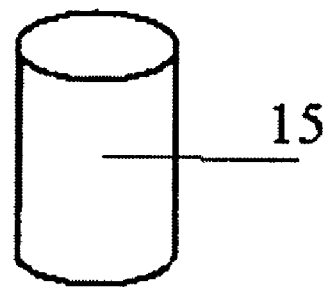
Figure 4F:
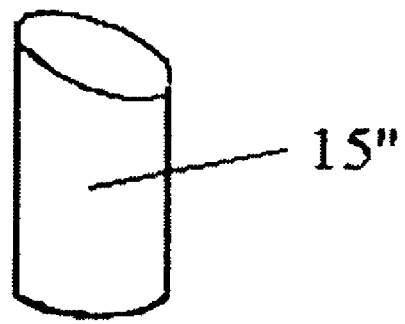

The geometry of the hole opening for the apertures in a manifold can also be chosen so as to direct the flux emanating therefrom preferentially in space. FIG. 4E again shows a hole 15 where the top plane of the exit aperture is flat or perpendicular to the symmetry axis of the hole. FIG. 4F alternatively shows a different hole, 15", where this hole is extended outward from the manifold surface by a tube that is shown to be straight, but could be curved, with the top plane of the exit aperture is tilted or at an angle to the symmetry axis of the hole or tube. The opening need not be confined to a plane but could have a geometric surface extending thereacross to the boundaries that curves. The heated inside surface of the exit aperture serves to direct the flux therethrough in the desired direction. These apertures may be in an arrangement allowing them to rotatably move and also linked to some actuation electrical, mechanical or magnetic means such that the aperture structures may be caused thereby to be rotated or selectively angularly positioned by using such means. Simply rotating the tilted aperture permits the direction of the emerging vapor to be changed, even during the deposition process if necessary, and continual rotation during processing will provide further spatial averaging of the flux if desired. Other similar methods can be envisioned to adjust the flux distribution. Calibration is done by mapping the thickness distribution of the resulting film coating after a trial deposition. The entire set of such holes can then be adjusted accordingly either separately or in real time.

Figure 5:
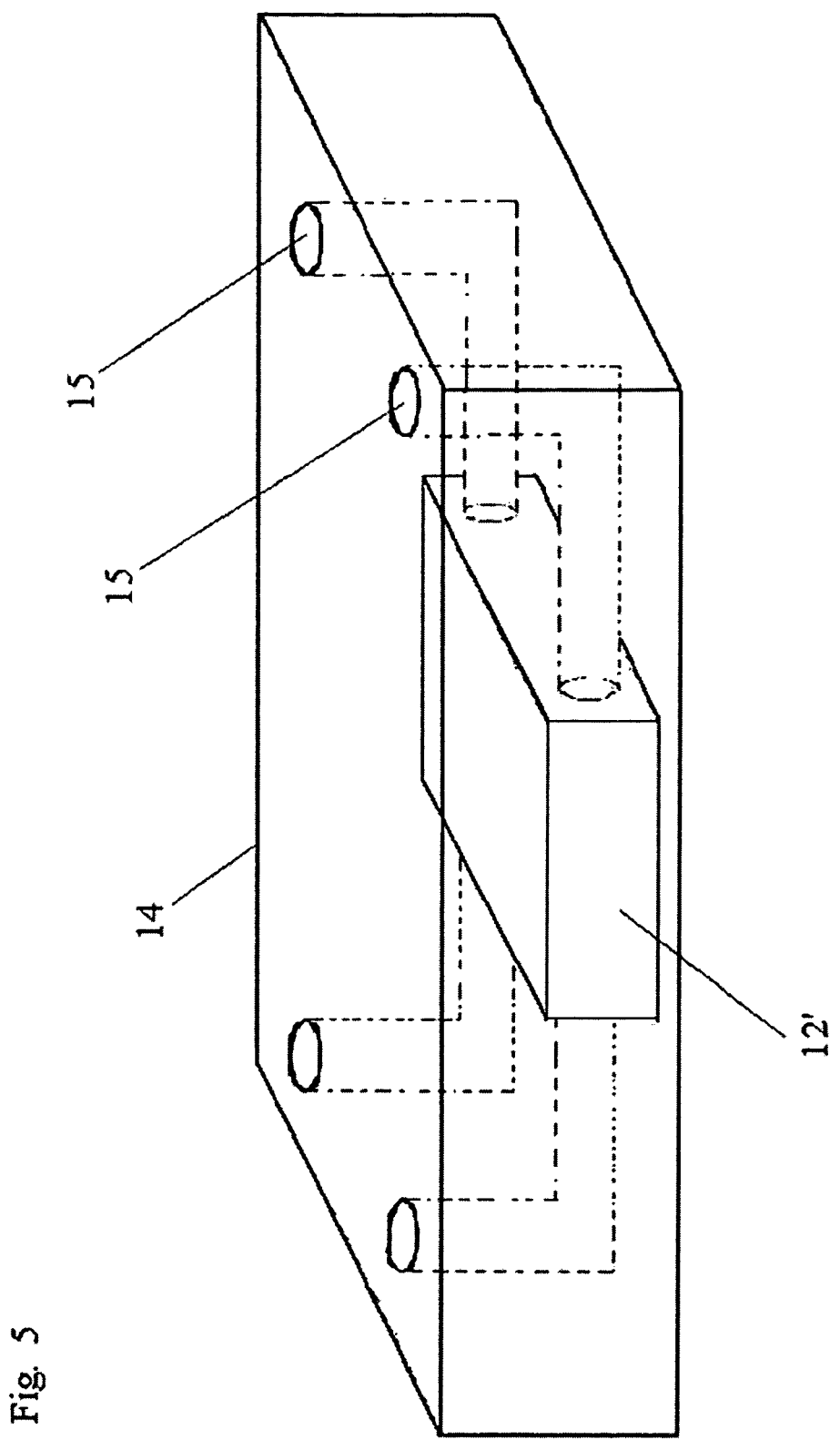
FIG. 5 shows a perspective view of a component useable in the embodiments of FIG. 1, FIGS. 6A and 6B show perspective views of components useable in the embodiments of FIG. 1.

Since a desired property of a deposited thin-film material may be enhanced by incorporation of a second material in a deposition, either for forming a compound or for being present as a dopant (in trace quantities) in the first material, means to evaporate a plurality of different materials using material evaporation source 10 is needed. One arrangement is a configuration in which more than one source crucible 11 is or can be connected into the same manifold 14 so that mixing of the fluxes from each source takes place before exiting holes 15 in manifold 14. This may not be practical in some situations if the material species from different sources have different temperatures tolerances, or if unwanted chemical reactions of the vapors may occur. These situations are overcome by providing an extended heated transport section, 12', that extends through manifold 14 to corresponding exit holes 15 placed at appropriate positions as indicated in FIG. 5. Another portion of heated transport section 12 can be provided to deliver other material fluxes to the interior of manifold 14 from which same can exit from other exit holes 15 not shown in FIG. 5.

Figure 6A:
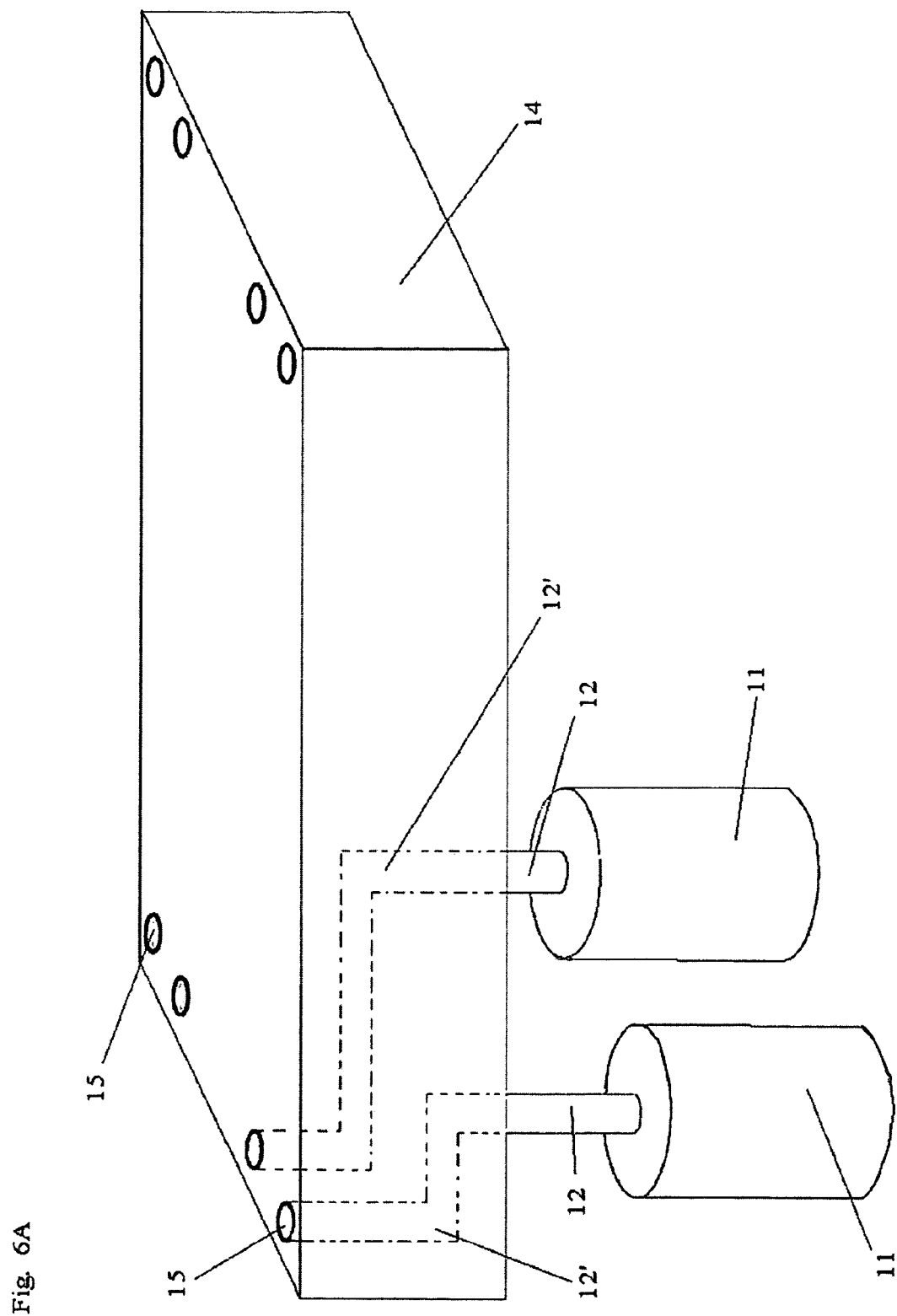
Figure 6B:
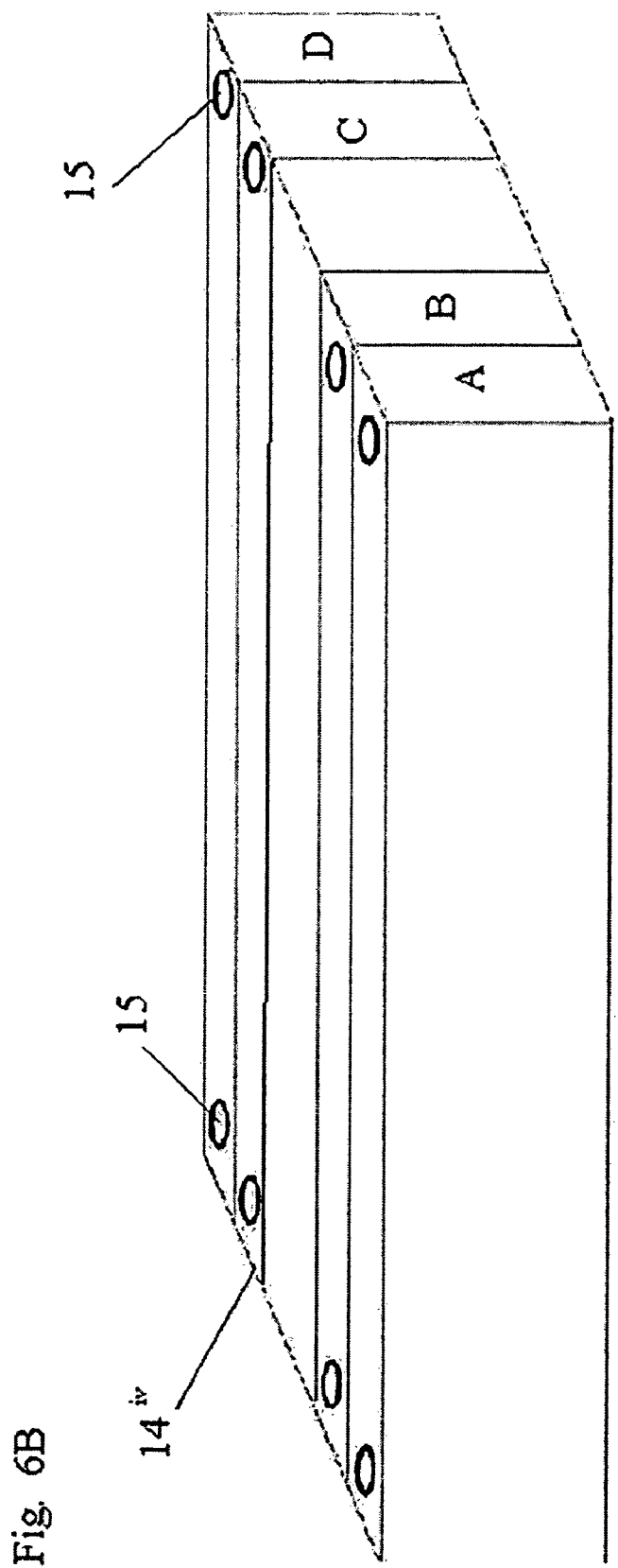

A plurality of different kinds of evaporant source materials may be combined and deposited on substrates in a deposition chamber in this manner. FIG. 6A shows how two materials are combined in this fashion. For clarity only one transport section 12 and 12' from each material source crucible 11 is illustrated but an arbitrary number of transport sections can be thus provided. These extension sections can be independently heated when needed to avoid condensation and, with adequate thermal isolation, each can be maintained separately with independent heating control. An alternative is to divide manifold 14 into separate sections to form a sectioned manifold, 14$^{iv}$, as shown in FIG. 6B, each section separately and independently heated and each thermally isolated from one another. Each such section thereby acts as a submanifold into which one or more evaporant materials can be conveyed en route to exiting into the vacuum deposition chamber. For example, one evaporant material flux can be directed into manifold sections marked A and C, and a second evaporant material flux directed into manifold sections B and D. The vapors then emerge, either simultaneously or sequentially, from sectioned manifold 14$^{iv}$ at the desired exit hole 15 locations to form uniform layers that incorporate these two materials. Additional holes in each section may be provided as determined required to obtain the desired spatial distributions of these materials.

Better utilization of valuable vacuum spaces inside deposition chambers, and facilitating the replenishing of charges of evaporation materials species in corresponding crucibles, leads to desire to position crucible or crucibles 11 external to such vacuum deposition chambers. Crucibles so positioned must still be connected to injector manifold 14 via heated transfer section or sections 12. Any maintenance or modification of the crucible heater and related parts is also made easier thereby which could then be accomplished without opening the deposition chamber and thereby breaking the vacuum therein. When crucible 11 is to be exposed to ambient pressure, a structural arrangement must also be adopted such that the vacuum level of the deposition chamber is still adequately maintained if breaking the vacuum is to be avoided. This may be simply accomplished by using the valve mechanism described above, i.e. needle valve 13, provided that the valve is suitably constructed. A needle valve that is to provide a vacuum seal when moved against a stationary valve seat requires both of the mating surfaces on the needle actuator and the valve seat have a smooth finish and well matched facing surface contours. Enhancing the valve sealing property can be accomplished by adding a gasket or O-ring means to the seat of the valve body where the needle actuator is moved into contact with that seat.

Further, two valves may be placed in series with one another along the flux path from crucible 11 to manifold 14 as a basis for providing additional sealing capabilities. One such valve is used to adjust and control the flux or vapor flow as described above in connection with valve 13 and the other to provide a rugged, complete seal when closed to prevent any vapor leakage from the deposition chamber. The structures of the two valves can be the same but may well differ according the two separate functional capabilities required of each in use in the material source evaporation system. In the flux control valve, for example, the valve needle and its matching valve seat may be shaped to effect more linear and finer flow control. In the sealing valve, the structure is made to withstand large forces when it is fully closed to improve the deposition and valve sealing properties.

Use of two such valves in series in the flux path permits the evaporant flux or vapor flow to be better stabilized and adjusted. Thus, the position of the control valve can be fixed for a certain flux requirement when a deposition process is finished. At that point the sealing valve can be closed to prevent any vapor leakage. When the succeeding deposition process commences, the identical flux value can be achieved as soon as the sealing valve is opened, since the position of the control valve has not been changed. Reproducing flux values is particularly desirable in a production environment.

Further enhancement of the sealing properties of such a material source evaporator, a pumping means may be implemented in the heated transport section 12 portion between these two valve. When both valves are closed, the difference in vacuum between that occurring in the deposition chamber, and that occurring in the transport section between the two valves, can be maintained at a minimum. Such "differential pumping", further ensures the vacuum integrity of the deposition chamber even when the remainder of the material source evaporator itself is removed for maintenance, material replenishment or other reasons. The reverse if also true in that, if the deposition chamber has to be vented to the atmosphere, the material source evaporator may be maintained at adequate vacuum so the that source material charges contained therein are not contaminated.

An alternative to use of another needle valve mechanism for the sealing valve is the use of "gate" valve wherein a blade means is made to slide across a tube section opening clearance. When the blade means is made to cover fully the tube opening (closed position), it can be made to press against a gasket on a flat flange surface around the tube section opening. The main function of the gate valve is to fully isolate the two sides, in a vacuum sense, even when pressure levels of the two sides are vastly different. The gate valve thus can provide the required isolation seal to maintain the deposition chamber at a desired vacuum level even with the material source evaporator side thereof being subsequently vented to atmospheric pressure. When necessary, a differential pumping means as described above may be installed between the two valves.

Figure 7:
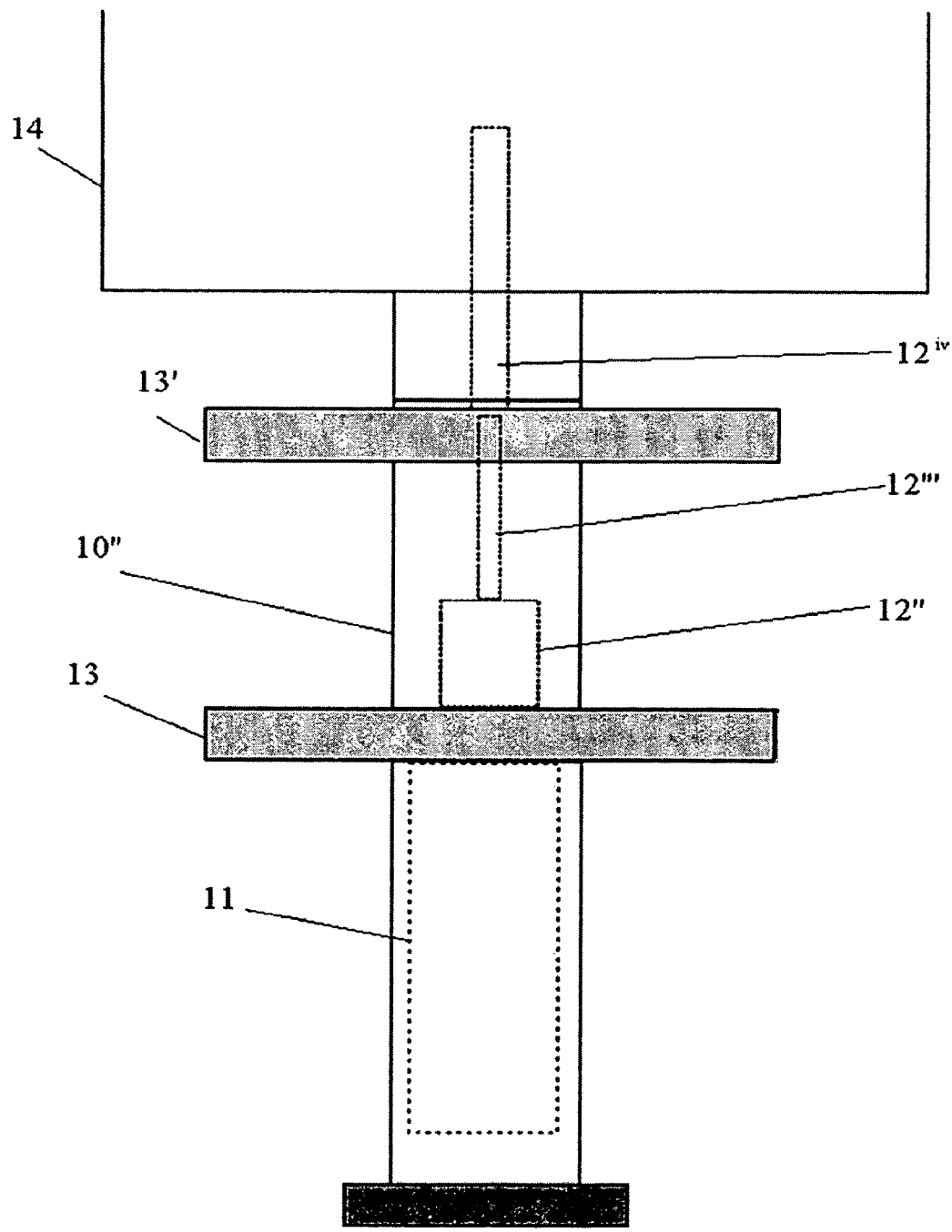
FIG. 7 shows a schematic side view of a the evaporator in the embodiment of FIG. 1B, FIGS. 8A and 8B show a side view and a partial cross section side view of an evaporator embodying the present invention.

Such a two in series valves configuration material source evaporator, 10", is schematically illustrated in FIG. 7, as a representation of evaporator 10' of FIG. 1B, in which a gate valve, 13', is positioned in heated transport section 12 between control (needle) valve 13 and manifold 14. Gate valve 13' can be actuated to reach a predetermined flow path cross sectional area setting with respect to the flux path through that valve when desired whether the valve gate therein controlling flow is to be set (typically manually) to being fully open, partially open or completely closed.

A first stationary portion, 12", of heated transport section 12 is connected to valve 13 and can accommodate having another moveable portion, 12'", sealable against gate 13', moved partially into it when moveable portion 12'" is retracted from gate 13', which, when done, is typically done manually. Thus, moveable portion 12'" can be retracted to be positioned in an out-of-the-way location before the gate valve is to be closed while a vacuum is still established in both the deposition chamber and the material source evaporator. Gate 13' can then be closed without damaging moveable portion 12'" and then the vacuum can be broken on the evaporator side of that valve for some purpose, such as repair or recharging, while the vacuum in the deposition chamber is maintained.

Thereafter, a vacuum can be reestablished in the evaporator allowing gate valve 13' to be opened without disturbing significantly the vacuum in the deposition chamber. Moveable portion 12'" is then extended to another stationary portion, 12$^{iv}$, of heated transport section 12 after gate valve 13' is opened. In this latter extended position, moveable portion 12'" and stationary portion 12$^{iv}$ are connected tightly to one another in a sealed arrangement to thereby allow passing of the vapor flux through each without leakage occurring between them.

Figure 8A:
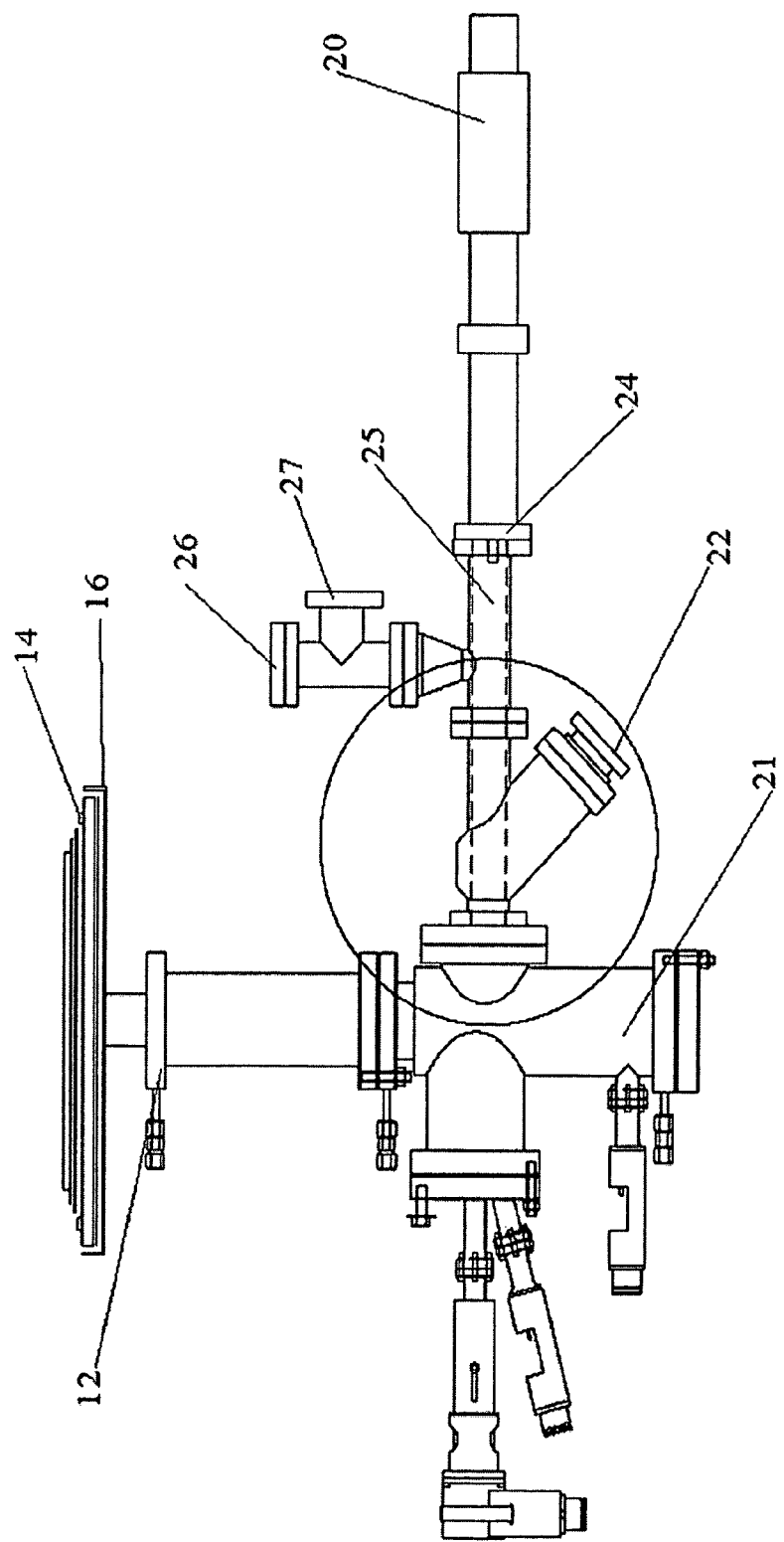

A further capability that can be provided for a material source evaporator that is very useful in the fabrication of thin-film devices in a deposition chamber is that of permitting the recharge of the evaporator materials charges species previously placed in crucible 11 after some depletion thereof that occurs through usage of the evaporator, all being done without interrupting or breaking the vacuum condition previously established in the deposition chamber. FIG. 8A shows a materials source evaporator, 10'", that is a modification of source 10' of FIG. 1B shown there having crucible 11 in an arrangement that is separately openable to the atmosphere without requiring the deposition chamber to also be similarly opened, this arrangement being external to the evacuable region of the deposition chamber where thin-film depositions are to selectively occur on fixed position substrates. Modified evaporator 10'" has a material charges conveying system, 20, attached to the compartment housing crucible 11. Other such material charges conveying systems can be attached to any one or all of other compartments containing similar crucibles for different kinds of material charges species of any number of vaporizing sources whether the source has a valve mechanism or not.

Figure 8B:
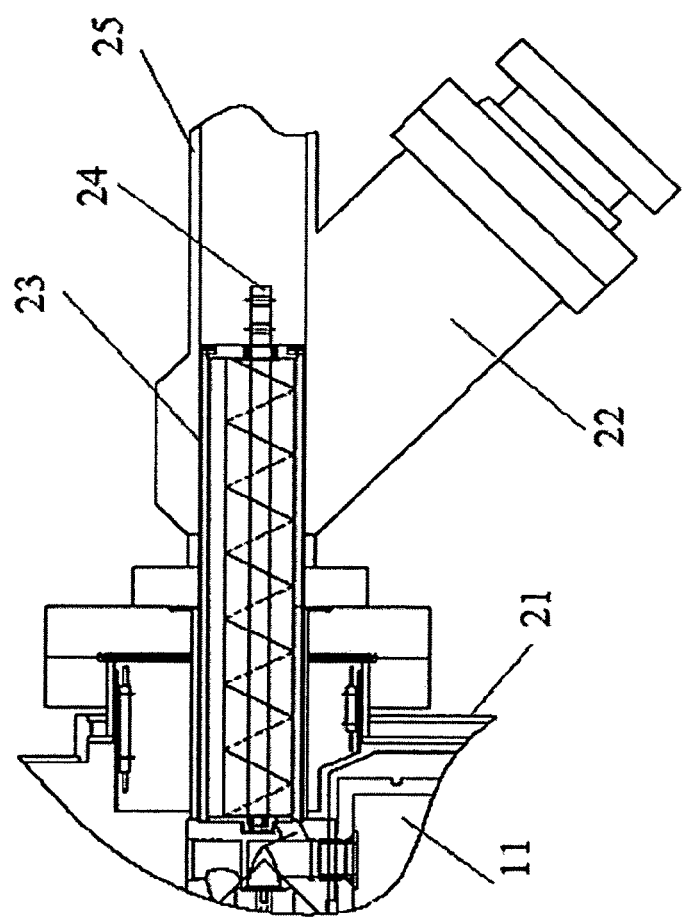

Crucible 11 is positioned inside a compartment, 21, and material charges conveying system 20 is attached to this compartment by a straight-through isolation valve, 22, located in the circle drawn in FIG. 8A which can seal compartment 21 to both allow deposition processes to be undertaken in the deposition chamber using modified evaporator 10'" and to allow material charges conveying system 20 to be removed from modified evaporator 10'". Straight-through isolation valve 22 has an internal clearance sufficient for a material charge delivery vessel, 23, which is shown in the partial cross section view in FIG. 8B taken from the portion of material charges conveying system 20 that is within the drawn circle in FIG. 8A and enlarged. Material charges conveying system 20 further has materials charges vessel advancement mechanism, 24, that acts through a transfer tube section, 25, to advance delivery vessel 23 through valve 22 partially into compartment 21. A materials charging tube, 26, is connected to transfer tube section 25 and has a vacuum pumping port, 27, extending therefrom so that a vacuum can be independently established, maintained and broken in material charges conveying system 20.

In the crucible deposition material recharging process, a suitable amount of the evaporator material charge species is first placed inside delivery vessel 23 at atmospheric pressure through materials charging tube 26. Material charges conveying system 20 is then sealed and evacuated through pumping port 27. If the evaporator material is provided inside a sealed container to be placed inside delivery vessel 23 in that form, the seal may be broken by a mechanical means such as a sharp blade or pin to free that material from the container. Such an arrangement allows avoiding the exposure of that material to air or contaminants throughout the recharging process. Vessel advancement mechanism 24 is coupled to delivery vessel 23 and, through a mechanical or magnetic arrangement or some combination thereof operated from the atmospheric pressure side of charges conveying system 20, delivery vessel 23 is advanced with the material charge therein through part of transfer tube section 25 and isolation valve 22 to thereby be partly inside compartment 21 to reach a point above crucible 11 where vessel 23 engages crucible 11 in completing a passageway therebetween so that the material charge in delivery vessel 23 can be forced into crucible 11 by another portion of advancement mechanism 24 such as a screw mechanism in delivery vessel 23 (not shown) providing a rotary motion to linear motion conversion that can be typically manually operated from the atmospheric pressure side of charges conveying system 20 to force the material powder or chunks out the end of the vessel into the crucible. Delivery vessel 23 is then retrieved using advancement mechanism 24 to its initial position where it received the material species charge and valve 22 is closed to permit the coating process in the deposition chamber to resume with the replenished material species charge in crucible 11.

To maintain a stable and controllable flux rate, a flux rate sensing device is incorporated at some one or more of the positions along the path followed by evaporants fluxes in material evaporation source 10 where parts of such fluxes can be sampled by this sensor. An example of such a sensor is quartz crystal monitor which is a commonly employed sensor for rate monitoring manufactured by companies such as Inficon (www.inficon.com) which generates a frequency shift in a signal as a function of the material deposited on it. The output of the sensor can then be used in a feedback control loop for controlling quantities of fluxes by adjusting the valve position or source crucible temperature, or both. Other sensors such as optical transmission, pressure sensor and interferometry techniques may alternatively be integrated into material source evaporator 10 by incorporating the optical components into the source structure.

A suitable placement of such a sensor is in the region generally outside the exit of injector manifold 14 such that part of the evaporant flux intersects this sensor. The sensor may be actuated in the vacuum established in the deposition chamber to thereby provide optimal evaporant flux measurements. However, another desirable place for the sensor is further upstream in the flux path to sample a greater portion of the flux to better enable evaporants at low flux rates to be detected.

Controlling one of several different evaporant fluxes requires making a corresponding sensor sensitive to just that one particular kind of evaporant material flux. This may be accomplished by forming a small exit hole in the heated transfer section 12 corresponding to that evaporant flux so that a tiny fraction of the flux may escape through that hole and be measured by that sensor placed in proximity thereto. The sensor maybe shielded or positioned relatively far from other kinds of evaporants.

FIG. 9A shows providing sensors with access to a corresponding single evaporant flux occurring in different portions of heated transfer section 12 that is allocated to conveying a single kind of material evaporant flux, just as in the arrangement shown in FIG. 6A. A sensor, 30, is positioned at an opening, $12^v$, in heated transfer section 12 near crucible source 11 for that material. A similar sensor 30 is positioned near exit aperture 15 from manifold 14 at the end of heated transfer section 12 for that material. With such proximity the sensor detects mostly evaporant flux material occurring in that particular portion of section 12. A similar configuration may be devised for the neighboring heated transport section 12 portion in FIG. 9A allocated to another material evaporant flux using another sensor such that each sensor is material specific so that its measurement of its material evaporant flux is not significantly interfered with by the material evaporant flux being measured by the previously described sensors.

Figure 9B:
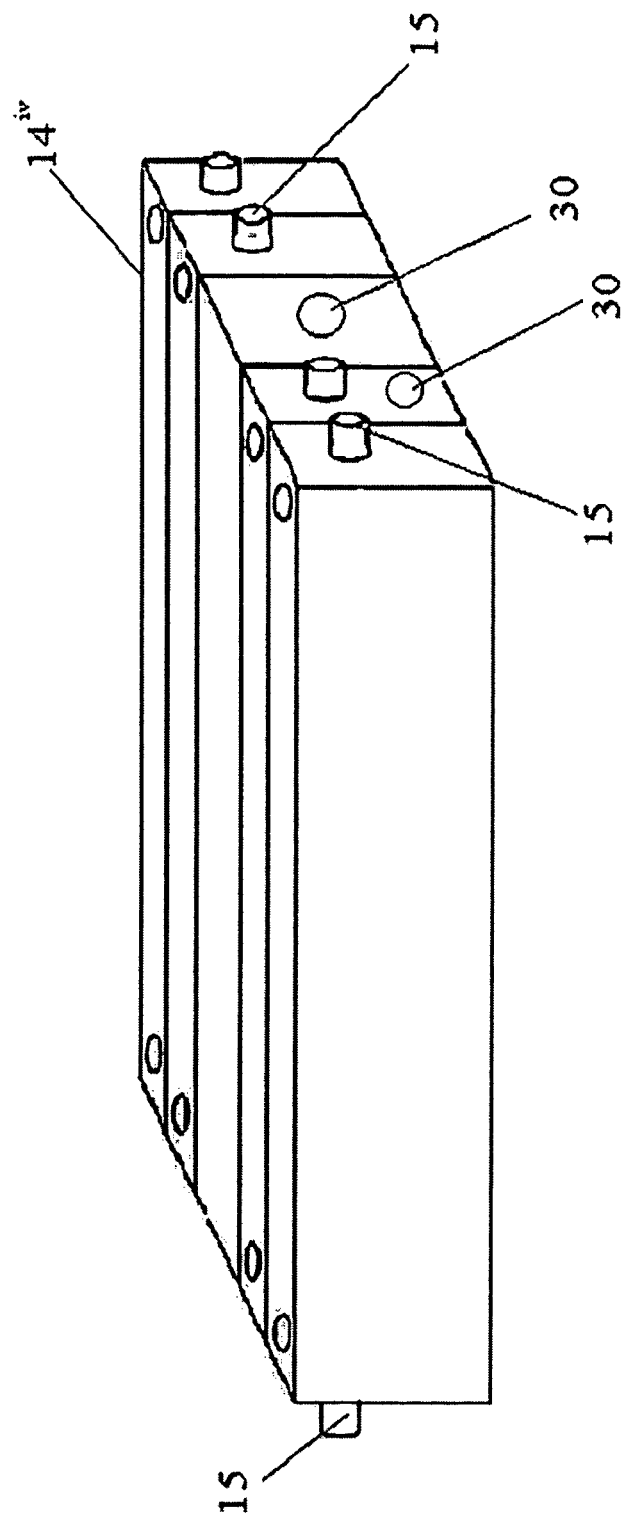

A similar arrangement can be provided for a sectional injector manifold like that shown in FIG. 6B, and a similar sectional injector manifold, $14^{iv}$, is depicted in FIG. 9B. Similar sensors 30 are positioned in the proximity of a corresponding section exit hole 15 in separate manifold sections to thereby have a high sensitivity to just the corresponding one kind of material evaporant flux. FIGS. 9A and 9B arrangements can be particularly useful for measurement of small material evaporant flux values and also for typically low flux value dopants.

In accommodating the different temperature requirements of various sections of material evaporator source 10, each heating element used along the various flux path structures is usually independently supplied electrical power and independently controlled insofar as maintaining it at a selected temperature. This requires a plurality of power supplies with separate temperature controllers that are typically implemented in corresponding PID (proportional-integral-derivative) feedback loops. However, a single power supply for all the heaters can be provided that distributes electrical power by means of an active power splitter used with an advanced PID controller. Such an arrangement utilizes a more cost effective power supply of higher power in combination with inexpensive solid state switches, such as power MOSFETs (Metal Oxide Semiconductor Field Effect Transistors), to provide a lower cost implementation and more effective power management.

Figure 10A:
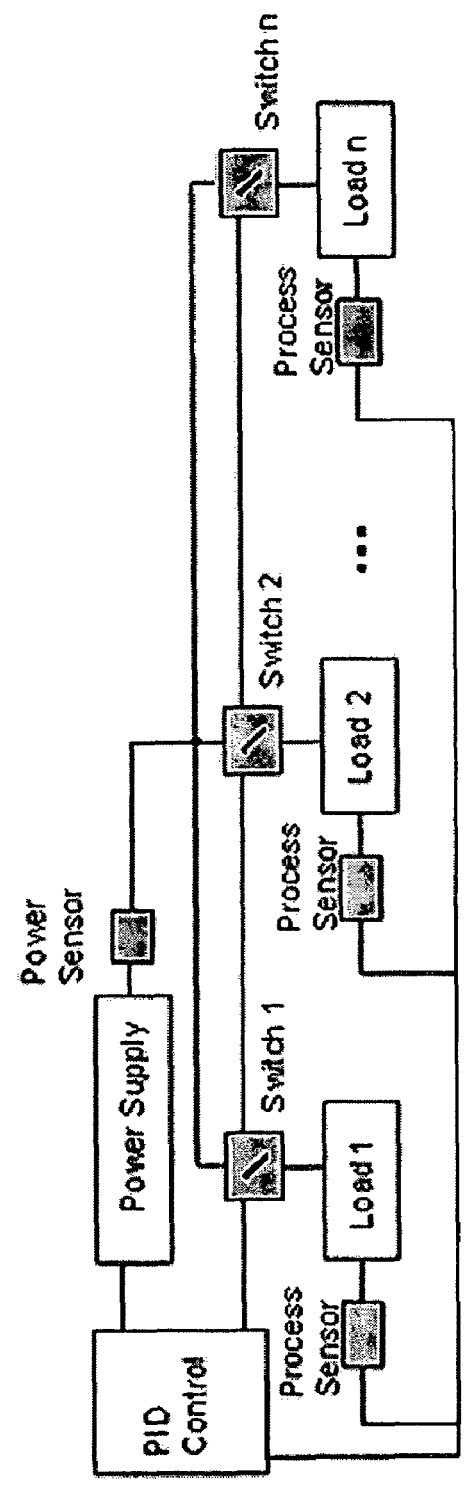
Figure 10B:
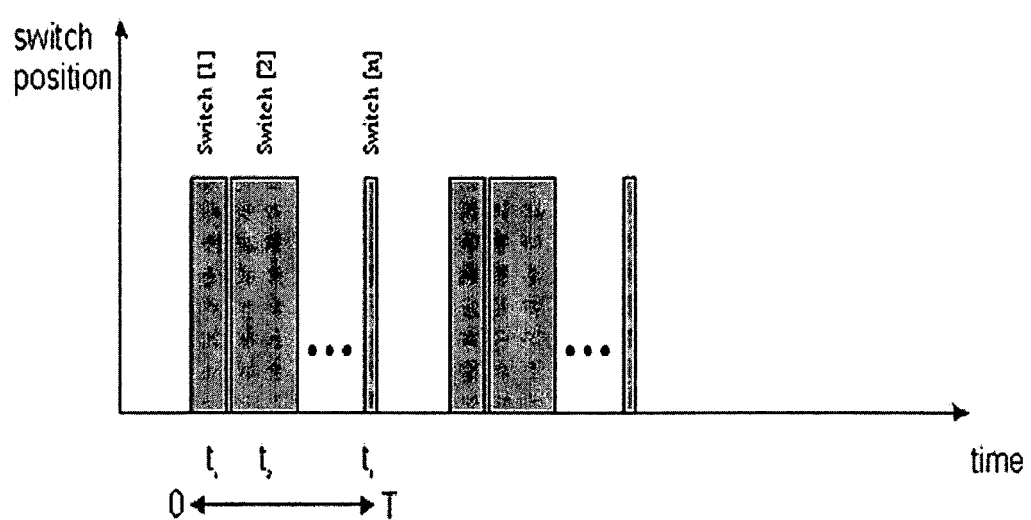

Such a control system is illustrated schematically in FIG. 10A where the PID controller opens and closes each switch i (i=1,2, ... n) in such a way that the average electrical power into load i equals the constant power that otherwise would have been provided thereto by a corresponding one of a plurality of power supplies. Each "on" time, or duty cycle $t_i$ of switch $s_i$, represents a fraction of the total refresh time T in a repeating cycle as shown in FIG. 10B. Slow thermal responses of the individual heating elements, as compared to the electronic switching times, and additional electronic buffering of the provided output electrical currents create an efficient way to expand the number of heating elements and to comply with electromagnetic interference regulations for emitted electronic noise.

Active current switching through use of digital control of solid state switches allows use of inexpensive digital signal processors to perform electrical power control for each heater. This reduces total cost compared to what would otherwise be encountered using analog circuit control. In addition, it enables implementation of fuzzy logic algorithms for advanced temperature control applications. Furthermore, active current switching of a plurality of heater circuits has the intrinsic feature of balancing power. It is in particular advantageous in this case because the heaters in the deposition source represent a coupled system, where the temperature of one section influences all other sections.

Although the present invention has been described with reference to preferred embodiments, workers skilled in the art will recognize that changes may be made in form and detail without departing from the spirit and scope of the invention.

The invention claimed is:

1. A material source evaporator for use with an evacuable interior deposition chamber in which evaporated materials are deposited on substrates, said evaporator comprising:

a container having an output port and having an associated heater that can heat an vaporizable material provided in said container to provide a vapor thereof at said output port;

a manifold having an input port and a plurality of output apertures on a common side thereof, including three positioned without centers thereof along a common straight line, and having an associated heater that can heat said material vapor provided in said manifold through said input port thereof to remain sufficiently vaporous to pass out of said output apertures, said output apertures being in a selected pattern in said manifold to provide a spatial distribution of said material vapor that results in a deposition thereof in a layer on an adjacent said substrate with a fixed position so that said layer has a thickness sufficiently uniform to be within three percent of that average thickness achieved over said substrate, and with at least one of said output apertures having a normal to a smooth geometric surface, a surface that is considered to extend across an aperture opening provided by that said output aperture to connect boundaries about that said opening, said normal extending at an angle to said manifold wall where that said output aperture is located therein and also with said one of said output apertures being rotatable about an axis at an angle to said normal; and a transport duct extending between said container output port and said manifold input port so as to transport only vapors for deposition and from vaporizable materials in corresponding containers thereof including said vapors of said vaporizable materials in said container.

2. A material source evaporator for use with an evacuable interior deposition chamber in which evaporated materials are deposited on substrates, said evaporator comprising:

a plurality of containers each having an output port and each having an associated heater that can heat a vaporizable material provided in that said container associated therewith to provide a vapor thereof at said output port of that said container;

a manifold with a plurality of submanifolds thermally isolated from one another to at least some extent each having an input port and a plurality of output apertures on a common side thereof, including three positioned without centers thereof along a common straight line, and each having an associated heater that can heat said material vapor provided in said submanifold through said input port therein to remain sufficiently vaporous to pass out of said output apertures in that said submanifold, and with at least one of said output apertures having a normal to a smooth geometric surface, a surface that is considered to extend across an aperture opening provided by that said output aperture to connect boundaries about that said opening, said normal extending at an angle to said manifold wall where that said output aperture is located therein and also with said one of said output apertures being rotatable about an axis at an angle to said normal; and a plurality of transport ducts each extending only between said output port of one of said plurality of containers and said input port of a corresponding one of said plurality of submanifolds.

3. A material source evaporator for use with an evacuable interior deposition chamber in which evaporated materials are deposited on substrates, said evaporator comprising:

a plurality of containers each having an output port and each having an associated heater that can heat a vaporizable material provided in that said container associated therewith to provide a vapor thereof at said output port of that said container;

a manifold having a plurality of input ports and a plurality of output apertures and having an associated heater that can heat said manifold, said plurality of output apertures being on a common side of said manifold, including three positioned without centers thereof along a common straight line, and with at least one of said output apertures having a normal to a smooth geometric surface, a surface that is considered to extend across an aperture opening provided by that said output aperture to connect boundaries about that said opening, said normal extending at an angle to said manifold wall where that said output aperture is located therein and also with said one of said output apertures being rotatable about an axis at an angle to said normal; and a plurality of transport ducts each extending between said output port of a corresponding one of said plurality of containers and a corresponding one of said plurality of input ports of said manifold and through that said input port to a colTesponding one of said plurality of output apertures in said manifold, said heater associated with said manifold for heating said manifold so that said material vapor from said output port of a said container provided to a corresponding one of said plurality of transport ducts remains sufficiently vaporous to pass out of said one of said output apertures corresponding thereto.

4. A material source evaporator for use with an evacuable interior deposition chamber in which evaporated materials are deposited on substrates, said evaporator comprising:

a container positioned in an evacuable compartment that is exterior to, but attached and sealable to said deposition chamber, with said container having an output port and having an associated heater that can heat a vaporizable material provided in said container to provide a vapor thereof at said output port;

a manifold positionable in a region located within said evacuable interior of said deposition chamber, said manifold having an input port and a plurality of output apertures on a common side thereof, including three positioned without centers thereof along a common straight line, and having an associated heater that can heat said material vapor provided in said manifold through said input port thereof to remain sufficiently vaporous to pass out of said output apertures, and with at least one of said output apertures having a normal to a smooth geometric surface, a surface that is considered to extend across an aperture opening provided by that said output aperture to connect boundaries about that said opening, said normal extending at an angle to said manifold wall where that said output aperture is located therein and also with said one of said output apertures being rotatable about an axis at an angle to said normal;

a transport duct extending between said container output port and said manifold input port so as to transport only vapors for deposition and from vaporizable materials in coffesponding containers thereof including said vapors of said vaporizable materials in said container; and an evacuable replenisher with a material injection port that is exterior to, but attached and sealable to said compartment, said replenisher having a material transferor therein that is engageable with said container and which can have selected materials inserted therein through said material injection port, said material transferor at engagement with said container being activatable to transfer any said selected material therein to said container.

5. A material source evaporator for use with an evacuable interior deposition chamber in which evaporated materials are deposited on substrates, said evaporator comprising:

a container having an output port and having an associated heater that can heat a vaporizable material provided in said container to provide a vapor thereof at said output port;

a manifold having an input port and a plurality of output apertures on a common side thereof, including three positioned without centers thereof along a common straight line, and having an associated heater that can heat said material vapor provided in said manifold through said input port thereof to remain sufficiently vaporous to pass out of said output apertures, and with at least one of said output apertures having a normal to a smooth geometric surface, a surface that is considered to extend across an aperture opening provided by that said output aperture to connect boundaries about that said opening, said normal extending at an angle to said manifold wall where that said output aperture is located therein and also with said one of said output apertures being rotatable about an axis at an angle to said normal;

a pair of flow control valves each having an input and an output and each controllable to selectively restrict rates of vapor flows between said input and said output thereof; and a transport duct extending between said container output port and said manifold input port so as to transport only vapors for deposition and from vaporizable materials in coffesponding containers thereof including said vapors of said vaporizable materials in said container, said transport duct having said pair of flow control valves positioned therein for controlling rates of vapor flows between said container output port and said manifold input port.

* * * * *

UNITED STATES PATENT AND TRADEMARK OFFICE
CERTIFICATE OF CORRECTION

| | | |
|---|---|---|
| PATENT NO. | : 7,611,587 B2 | Page 1 of 1 |
| APPLICATION NO. | : 10/848258 | |
| DATED | : November 3, 2009 | |
| INVENTOR(S) | : Peter P. Chow et al. | |

It is certified that error appears in the above-identified patent and that said Letters Patent is hereby corrected as shown below:

Col. 12, Line 61
    Delete "coffesponding"
    Insert --corresponding--

Col. 13, Line 49
    Delete "colTesponding"
    Insert --corresponding--

Col. 14, Line 20
    Delete "coffesponding"
    Insert --corresponding--

Col. 14, Line 58
    Delete "coffesponding"
    Insert --corresponding--

Signed and Sealed this
Twelfth Day of April, 2011

David J. Kappos
*Director of the United States Patent and Trademark Office*